United States Patent [19]

Ogura

[11] Patent Number: 4,636,981
[45] Date of Patent: Jan. 13, 1987

[54] SEMICONDUCTOR MEMORY DEVICE HAVING A VOLTAGE PUSH-UP CIRCUIT

[75] Inventor: Mitsugi Ogura, Yokohama, Japan

[73] Assignee: Tokyo Shibaura Denki Kabushiki Kaisha, Kawasaki, Japan

[21] Appl. No.: 514,107

[22] Filed: Jul. 15, 1983

[30] Foreign Application Priority Data

Jul. 19, 1982 [JP] Japan .................. 57-125338

[51] Int. Cl.$^4$ .............................. G11C 11/40
[52] U.S. Cl. .................. 365/203; 361/226; 361/189; 307/482
[58] Field of Search ........... 365/226, 203, 189, 204; 307/482

[56] References Cited

U.S. PATENT DOCUMENTS 3,765,002 10/1973 Basse ..................... 340/173 CA
4,404,661 9/1983 Nagayama et al. ........... 365/203
4,417,329 11/1983 Mezawa et al. ............. 365/203
4,475,178 10/1984 Kinoshita ................. 365/203
4,503,343 3/1985 Ohuchi .................... 307/482

OTHER PUBLICATIONS

Taniguchi et al. "Fully Boosted 64k Dynamic Ram with Automatic and Self-Refresh", vol. SC-16, No. 5, Oct. 81, pp. 492-498, IEEE Journal of Solid State Circuits.
Japanese Patent Disclosure (KOKAI) No. 52-123849, Hiroshi Watanabe, 1977.
Japanese Patent Disclosure (KOKAI) No. 54-158828, Mitsugi Ogura, 1979.
Rao et al., "64-K Dynamic RAM Needs Only One 5-Volt Supply to Outstrip 64-K Parts", Electronics, pp. 109-116, Fig. 4, Sep. 4, 1978.

Primary Examiner—Terrell W. Fears
Attorney, Agent, or Firm—Finnegan, Henderson, Farabow, Garrett & Dunner

[57] ABSTRACT

A semiconductor memory device includes charge storage type memory cells, word lines and a bit line connected to the memory cells, a sense amplifier for detecting the memory data on the bit line, and a voltage push-up circuit for setting up a potential on the bit line. The voltage push-up circuit at first sets the potential on the bit line at a power supply voltage level after the memory data having a high logic level is detected by the sense amplifier, and then pushes up the potential on the bit line to a higher potential level than the power supply voltage.

4 Claims, 15 Drawing Figures

FIG. 4
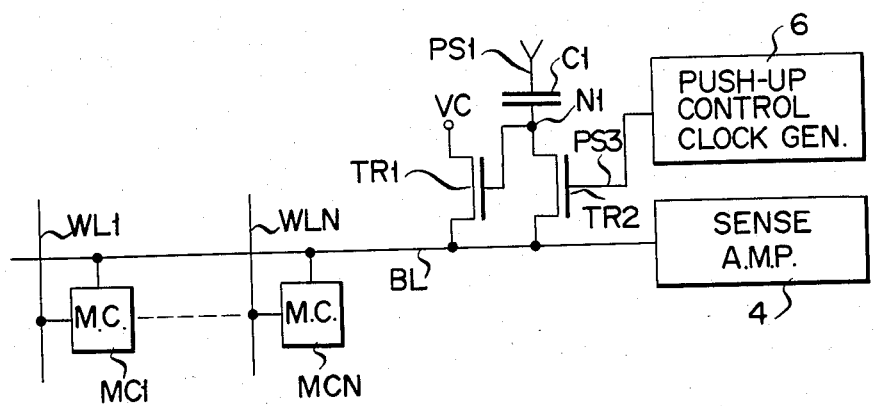
FIG. 5
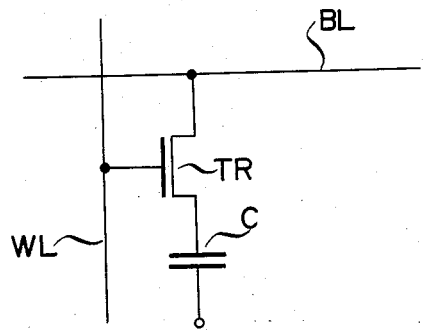
FIG. 6A (POTENTIAL AT BL)
FIG. 6B (POTENTIAL AT N1)
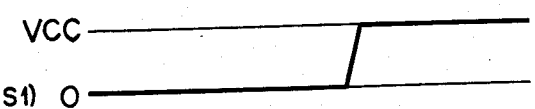
FIG. 6C (POTENTIAL AT PS1)
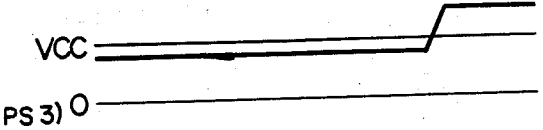
FIG. 6D (POTENTIAL AT PS3)

FIG. 7
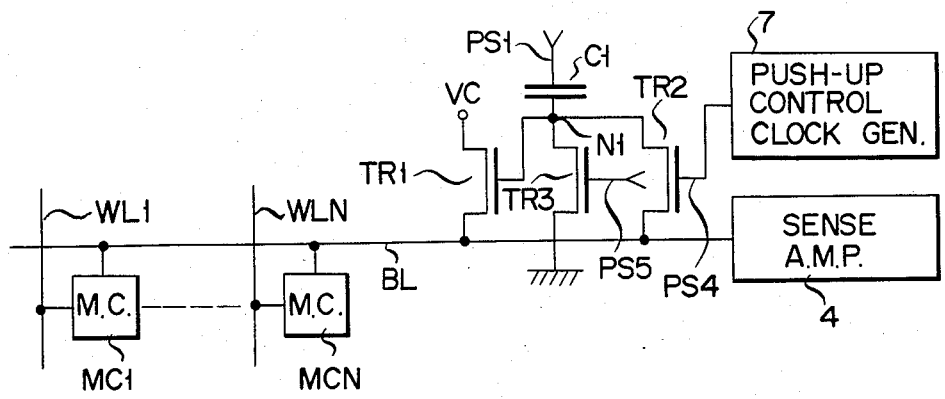
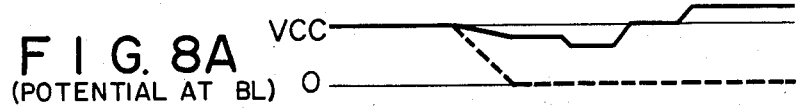
FIG. 8A
(POTENTIAL AT BL)
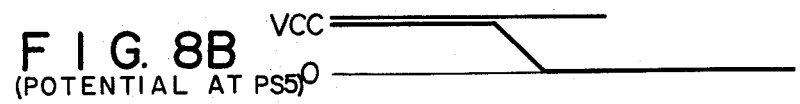
FIG. 8B
(POTENTIAL AT PS5)
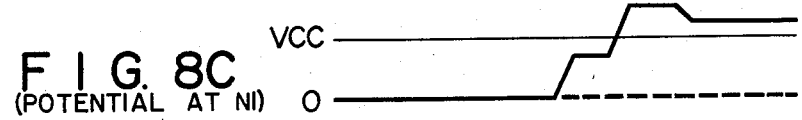
FIG. 8C
(POTENTIAL AT NI)
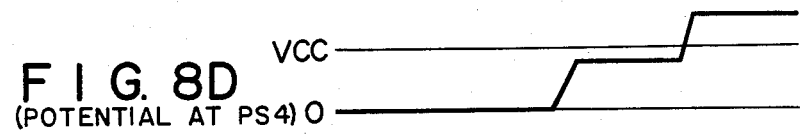
FIG. 8D
(POTENTIAL AT PS4)
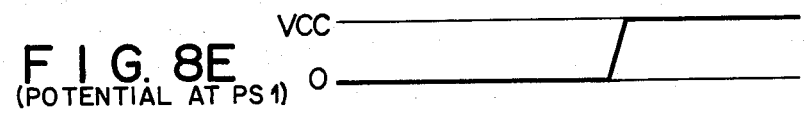
FIG. 8E
(POTENTIAL AT PS1)

SEMICONDUCTOR MEMORY DEVICE HAVING A VOLTAGE PUSH-UP CIRCUIT

BACKGROUND OF THE INVENTION

The present invention relates to a semiconductor memory device.

The memory capacity of a dynamic random access memory (DRAM) is increasing significantly, and DRAMs having a large capacity of 64 kbit are already currently mass-produced. However, in a 64-kbit RAM of this type, since the power supply voltage is lowered from 12 V to 5 V, the amount of storage charge is reduced. When a memory cell of such a 64-kbit RAM stores a voltage lower than the power supply voltage by a threshold voltage of the cell as in the case of an ordinary RAM of small memory capacity, the loss in the storage charge in the cell amounts to about 20% due to the power supply voltage of 5 V. Such a loss results in degradation of the dynamic memory cell characteristics. For example, when the storage charge decreases, the memory is more easily subject to so-called soft error which is caused by α-particles. Soft error is a phenomenon in which α-particles produced in the process of radioactive decay of uranium or thorium in a package or the like enter into the semiconductor substrate to generate electrons therein, and the electrons are trapped by the depletion layer and temporarily render the memory cell defective. In order to prevent such a soft error, it is preferable to increase the storage charge of the memory cell.

A thinner dielectric film may be used to increase the capacitance of the memory cell and to obtain the desired amount of the storage charge. However, this renders the manufacture of the device difficult, lowers the withstand voltage of the resultant device, and also lowers the manufacturing yield of the devices.

In order to prevent a loss in the storage charge, it is also conceivable to increase the potential on the bit line and to hold a voltage equivalent to the power supply voltage in the memory cell.

FIG. 1 shows a circuit diagram of part of a conventional memory device having a pull-up function for boosting the potential on a bit line. The memory device has memory cells MC1 to MCN which are commonly connected to a bit line BL and which are respectively coupled to word lines WL1 to WLN, a pull-up circuit 2, and a sense amplifier 4 which is coupled to the bit line BL and which detects and amplifies the data transmitted on the bit line BL. The pull-up circuit 2 has a MOS transistor TR1 coupled between a power supply terminal VC and the bit line BL, a MOS transistor TR2 coupled between a node N1 or the gate of the MOS transistor TR1 and the bit line BL, and a capacitor C1, one end of which is connected to the node N1 and the other end of which is connected to receive a pull-up signal PS1.

The operation of the memory device shown in FIG. 1 will now be described with reference to FIGS. 2(A) to 2(C). Prior to readout of data from a memory cell, the bit line BL is precharged to a power supply voltage level VCC, as shown in FIG. 2(A). In this case, the potential at the node N1 is set to a potential level which is lower than the power supply voltage VCC by the threshold voltage of the MOS transistor TR2, as shown in FIG. 2(B). When one of the memory cells MC1 to MCN is selected thereafter, the potential on the bit line BL changes in accordance with the data of the selected memory cell. When the data stored in the selected memory cell is "1", for example, the potential on the bit line BL is kept at a potential level slightly lower than the power supply voltage, as indicated by the solid curve shown in FIG. 2(A). On the other hand, when this data is "0", the potential on the bit line BL is lowered to 0 V, as indicated by the broken curve shown in FIG. 2(A). The potential on the bit line BL is then detected and amplified by the sense amplifier 4.

When the pull-up signal PS1 goes high thereafter, as shown in FIG. 2(C), the potential at the node N1 is pulled up to a potential level which is sufficiently higher than the power supply voltage VCC, as indicated by the solid curve shown in FIG. 2(B). Then, the MOS transistor TR1 is completely turned on, and the potential on the bit line BL is kept at the power supply voltage level as shown in FIG. 2(A). The memory cell stores the same amount of storage charge as that in the initial state.

In the memory device shown in FIG. 1, the potential on the bit line BL is held at the power supply voltage level VCC, as has been described earlier. However, when a memory device of a large memory capacity is formed to have a high density, the capacitance of the storage capacitor of each memory cell is made small, so that a sufficient storage charge can not be stored within this memory cell. In order to obtain a satisfactory storage charge, the potential on the bit line BL must be set higher than the power supply voltage level VCC, and a still higher voltage must be applied across the storage capacitor of the memory cell. For achieving this purpose, a pull-up capacitor C2 may be connected to the bit line BL as shown in FIG. 3, and a pull-up signal PS2 is applied to the capacitor C2 at a proper timing, so that the potential on the bit line BL may be set at a level higher than the power supply voltage level. However, with this method, the capacitance on the bit line BL is inadvertently increased. Accordingly, the logic level of the data read out from one of the memory cells MC1 to MCN onto the bit line BL is lowered, resulting in an impractical memory device.

SUMMARY OF THE INVENTION

It is an object of the present invention to provide a semiconductor memory device which can set the potential on a bit line at a level higher than the power supply voltage level, so that the memory cells may store a larger amount of storage charge.

This object is achieved by a semiconductor memory device including a plurality of charge storage type memory cells, word lines for selecting at least one of the memory cells, at least one bit line for transferring memory data, a sense amplifier circuit for detecting the memory data on the bit line, and a voltage push-up circuit for at first setting a potential on the bit line at a potential level equal to a power supply voltage after the memory data having a predetermined logic level is detected by the sense amplifier circuit, and then pushing up the potential on the bit line at a potential level over the power supply voltage.

In the present invention, since the potential on the bit line is set at a level higher than the power supply voltage level, a large amount of storage charge may be stored in a memory cell. Furthermore, it is not necessary to couple a capacitor of a large capacitance to the bit line or to form a thin dielectric film for a memory capacitor. Accordingly, the memory characteristics are not adversely affected, and the memory data can be detected with high sensitivity.

BRIEF DESCRIPTION OF THE DRAWINGS

FIG. 4 is a circuit diagram of part of a semiconductor memory device according to an embodiment of the present invention;

FIG. 5 shows the configuration of a memory cell shown in FIG. 4;

FIGS. 6A to 6D show signal waveforms explaining the operation of the memory device shown in FIGS. 4 and 5;

FIG. 7 is a circuit diagram of a part of a semiconductor memory device according to another embodiment of the present invention; and FIGS. 8A to 8E show signal waveforms explaining the operation of the memory device shown in FIG. 7.

DETAILED DESCRIPTION OF THE PREFERRED EMBODIMENTS

Figure 1:
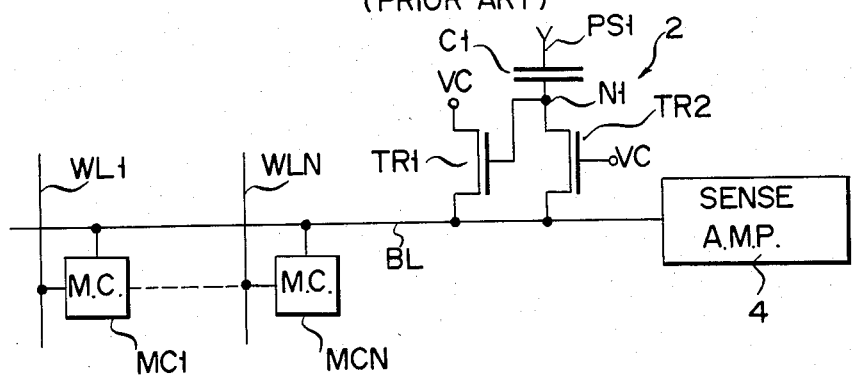
FIG. 1 is a circuit diagram of a conventional memory device having a push-up function for pushing up the potential on a bit line.
Figure 2:
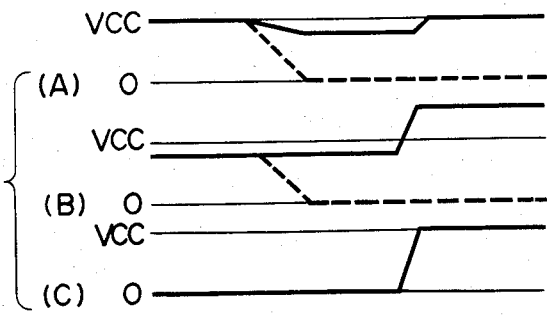
FIGS. 2(A) to 2(C) show signal waveforms explaining the operation of the memory device shown in FIG. 1.
Figure 3:
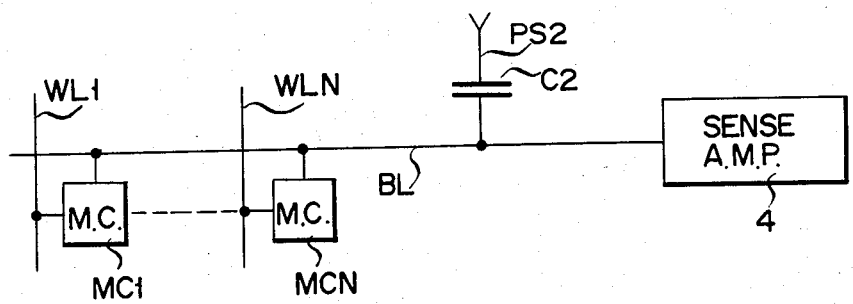
FIG. 3 is a circuit diagram of part of another conventional memory device having a push-up function.

FIG. 4 is a circuit diagram of a part of a semiconductor memory device according to an embodiment of the present invention. The memory device has the same configuration as that shown in FIG. 1 except that it further includes a push-up control clock generator 6 for supplying an output signal PS3 to the gate of a MOS transistor TR2. The push-up control clock generator 6 includes, for example, a bootstrap circuit, and supplies a step-up voltage to the gate of the MOS transistor TR2. As will be described later, in the normal operation mode, the step-up voltage is held at a slightly lower level than the power supply voltage VCC, for example, at 4 V, and is pushed up to a potential level, for example, 7.5 V which is higher than the power supply voltage VCC after detection and amplification of the data from one of the memory cells MC1 to MCN by the sense amplifier 4. Each of the memory cells MC1 to MCN has the same configuration; each memory cell includes a MOS transistor TR, the gate of which is coupled to a word line WL and one end of the current path of which is coupled to the bit line BL, and a capacitor C coupled between the other end of the current path of the MOS transistor TR and a reference power supply terminal.

The operation of the memory device shown in FIGS. 4 and 5 will now be described with reference to the signal waveforms shown in FIGS. 6A to 6D. Prior to readout of the data from a memory cell, the bit line BL is precharged to the power supply voltage level VCC as shown in FIG. 6A. In this case, the potential at the node N1 is set at a potential level which is lower than the power supply voltage VCC by the threshold voltage of the MOS transistor TR2, as shown in FIG. 6B. When one of the memory cells MC1 to MCN is selected thereafter, the potential on the bit line BL changes in accordance with the data read out from this selected memory cell. When the data read out from the selected memory cell is "1", for example, the potential on the bit line BL is lowered to a level which is slightly lower than the power supply voltage VCC, as indicated by the solid line in FIG. 6A. On the other hand, if the data read out from the selected memory cell is "0", the potential on the bit line BL is lowered to 0 V, as indicated by the broken line in FIG. 6A. Then, the potential on the bit line BL is detected and amplified by the sense amplifier 4.

Thereafter, as shown in FIG. 6C, when a push-up signal PS1 to be applied to a capacitor C1 is increased to the power supply voltage level VCC, the potential at the node N1 is pushed up to a potential level which is sufficiently higher than the power supply voltage VCC, as indicated by the solid line in FIG. 6B. In this case, the potential on the bit line BL is determined by the capacitance ratio of the stray capacitance associated with the node N1 to the capacitance of the capacitor C1. Assume that this capacitance ratio is 1:4, and that the potential at the node N1 is 4 V immediately before the push-up signal PS1 changes from 0 V to 5 V. In this case, a potential VN at the node N1 after the push-up signal PS1 changes from 0 V to 5 V may be given by the following expression:

$$VN = 4 + \tfrac{4}{5} \times 5 = 8 \ (V)$$

Then, the MOS transistor TR1 is completely ON, and the potential on the bit line BL returns to the power supply voltage level VCC as shown in FIG. 6A. Thereafter, as shown in FIG. 6D, an output voltage PS3 from the push-up control clock generator 6 is pushed up from 4 V to 7.5 V, for example. In this case, the MOS transistor TR2 is completely ON, and the potential at the node N1 is set at a potential level which is determined by the ratio of stray capacitances CN and CB associated with the node N1 and the bit line BL, respectively, and the ratio of the potentials at the node N1 and on the bit line BL immediately before the output voltage PS3 is pushed up. For example, when the capacitances CN and CB are given as 0.2 pF and 0.5 pF, a potential VN1 at the node N1 is given by the following equation:

$$VN1 = (0.2 \times 8 + 0.5 \times 5)/(0.2 + 0.5) = 5.86 \ (V)$$

In this case, the potential on the bit line BL also becomes 5.86 V. When the potential on the word line WL is set at a potential level which is higher than the potential on the bit line BL by at least the threshold voltage of the MOS transistor TR, then a voltage of 5.86 V, that is, a voltage sufficiently higher than the power supply voltage VCC (=5 V), is applied across the capacitor C of a selected one of the memory cells MC1 to MCN. This selected memory cell can then store a large amount of storage charge. In order to store the amount of charge corresponding to the pushed-up potential level on the bit line BL, each capacitor C of the memory cells is formed of, for example, a depletion-type MOS capacitor.

FIG. 7 is a circuit diagram of part of a semiconductor memory device according to another embodiment of the present invention. The memory device has the same configuration as that of the memory device shown in FIG. 1 except that a MOS transistor TR3 is connected between a node N1 and ground, and a push-up control clock generator 7 for supplying an output voltage PS4 to the gate of a MOS transistor TR2 is used in place of the push-up control clock generator 6.

Prior to readout of data from one of the memory cells, the bit line BL is precharged to the power supply voltage level VCC, as shown in FIG. 8A. However, since a signal PS5 slightly lower than the power supply voltage VCC is applied to the gate of the MOS transistor TR3, as shown in FIG. 8B, the potential at the node N1 is held at 0 V, as shown in FIG. 8C. When one of the memory cells MC1 to MCN is selected in this state, the potential on the bit line BL is lowered to a potential level slightly lower than the power supply voltage level VCC or to 0 V, as indicated by the solid or broken curve, in accordance with the data "0" or "1" read out from the selected memory cell. At this time, the potential on the bit line BL is detected and amplified by the sense amplifier 4.

Thereafter, the signal PS5 is lowered to 0 V to turn off the MOS transistor TR3, and the output voltage PS4 from the push-up control clock generator 7 is increased from 0 V to a potential level slightly lower than the power supply voltage VCC (e.g., 4 V), as shown in FIG. 8D. Then, the potential at the node N1 is increased to and held at a potential level which is lower than the power supply voltage VCC, as shown in FIG. 8C. At the same time, the potential on the bit line BL is slightly decreased as shown in FIG. 8A. When the push-up signal PS1 applied to the capacitor C1 is increased to the power supply voltage VCC, the potential at the node N1 is pushed up to a potential level which is higher than the power supply voltage level, as shown in FIG. 8C. Then, the MOS transistor TR1 is completely turned on, and the potential on the bit line BL is pushed up to the power supply voltage level VCC, as shown in FIG. 8A. Thereafter, the output voltage PS4 from the push-up control clock generator 7 is increased to a potential level which is significantly higher than the power supply voltage VCC. The potential on the bit line BL is then pushed up to a potential at the node N1 through the MOS transistor TR2. In other words, the potential on the bit line BL is set at a potential level higher than the power supply voltage VCC. When the data "0" is read out, the potential at the node N1 is held at 0 V, as indicated by the broken curve in FIG. 8C.

In this embodiment, the potential at the node N1 is set at 0 V in each readout cycle, so that no potential hysteresis may be produced. Therefore, the memory device will not be subject to adverse effects of the bump down of the power supply voltage, and the degree of fluctuation in the power source voltage is improved. Since the MOS transistor TR1 is kept OFF in each readout cycle, the charge on the bit line BL may be discharged quickly, and the potential on the bit line BL may be stabilized quickly. Since the bit line BL may not be inadvertently charged through the MOS transistor TR1, the power consumption may be reduced to a minimum.

Although the present invention has been described with reference to the particular embodiments, the present invention is not limited to these embodiments. For example, in the above embodiment, for the sake of simplicity, one row of memory cells MC1 to MCN is used. However, it can easily be understood that, in practice, a matrix of memory cells may be used. In this case, it is possible to connect a push-up control clock generator commonly to a plurality of push-up circuits.

What is claimed is:

1. A semiconductor memory device comprising:
   (A) a plurality of charge storage type memory cells;
   (B) a plurality of word lines connected to said plurality of charge storage type memory cells to selectively activate at least one of said plurality of charge storage type memory cells;
   (C) at least one bit line connected to said plurality of charge storage type memory cells to transfer memory data;
   (D) sense amplifying means for detecting the memory data on said at least one bit line; and
   (E) voltage push-up means connected to said at least one bit line for setting a potential on said at least one bit line to an end potential level over a power supply voltage level to increase a charge stored in any of said plurality of charge storage type memory cells said voltage push-up means including
      (a) a first MOS transistor with a current path connected at one end to said at least one bit line and connected at another end to receive a voltage equal to the power supply voltage level, said first MOS transistor being operative to set said at least one bit line to a first potential level substantially equal to said power supply voltage level at times when said first MOS transistor is conductive,
      (b) a capacitor connected at one end to receive a first signal applied after the memory data having a predetermined logic level is detected by said sense amplifying means, said first signal having a potential level substantially equal to said power supply voltage level, said capacitor connected at another end to render said first MOS transistor conductive upon application of said first signal,
      (c) push-up control clock generating circuit means for generating a second potential level higher than said end potential level, and
      (d) a second MOS transistor with a current path connected at one end to said another end of said capacitor and to a gate of said first MOS transistor and at another end to said at least one bit line and with a gate connected to, and rendered conductive in response to said second potential level for setting the potential on said at least one bit line to said end potential level at times when said first MOS transistor and said second MOS transistor are both conductive at the same time.

2. A semiconductor memory device according to claim 1, wherein each of said plurality of charge storage type memory cells is formed of a MOS transistor whose gate is connected to a corresponding one of said word lines and a depletion type MOS capacitor connected to said bit line through said MOS transistor.

3. A semiconductor memory device comprising:
   (A) a plurality of charge storage type memory cells;
   (B) a plurality of word lines connected to said plurality of charge storage type memory cells to selectively activate at least one of said plurality of charge storage type memory cells;
   (C) at least one bit line connected to said plurality of charge storage type memory cells to transfer memory data;
   (D) sense amplifying means for detecting the memory data on said at least one bit line; and
   (E) voltage push-up means connected to said at least one bit line for setting a potential on said at least one bit line to an end potential level over a power supply voltage level, to increase a charge stored in any of said plurality of charge storage type memory cells, said at least one bit line being kept at a reference potential level at times when said plurality of charge storage type memory cells are inactive, said voltage push-up means including
      (a) a first MOS transistor with a current path connected at one end to said at least one bit line and connected at another end to receive a voltage equal to the power supply voltage level, said first MOS transistor being operative to set said at least one bit line to a first potential level substantially equal to said power supply voltage level at times when said first MOS transistor is conductive, (b) a capacitor connected at one end to receive a first signal applied after the memory data having a predetermined logic level is detected by said sense amplifying means, said first signal having a potential level substantially equal to said power supply voltage level, said capacitor connected at another end to render said first MOS transistor conductive upon application of said first signal, (c) push-up control clock generating circuit means for generating a second potential level higher than said end potential level, (d) a second MOS transistor with a current path connected at one end to said another end of said capacitor and to a gate of said first MOS transistor and at another end to said at least one bit line and with a gate connected to, and rendered conductive in response to said second potential level for setting the potential on said at least one bit line to said end potential level at times when said first MOS transistor and said second MOS transistor are both conductive at the same time, and (e) switching means, connected at one end to the connection point between said capacitor and second MOS transistor and connected at another end to receive a voltage equal to said reference potential level, for setting a potential on said connection point at the reference potential level while the said at least one bit line is at the reference potential level.

4. A semiconductor memory device comprising:
(A) a plurality of charge storage type memory cells;
(B) a plurality of word lines connected to said plurality of charge storage type memory cells to selectively activate at least one of said plurality of charge storage type memory cells;
(C) at least one bit line connected to said plurality of charge storage type memory cells to transfer memory data;
(D) sense amplifying means for detecting the memory data on said at least one bit line; and
(E) voltage push-up means connected to said at least one bit line for setting a potential on said at least one bit line to an end potential level over a power supply voltage level to increase a charge stored in any of said plurality of charge storage type memory cells, said at least one bit line being kept at a reference potential level at times when said plurality of charge storage type memory cells are inactive, said voltage push-up means including (a) a first MOS transistor with a current path connected at one end to said at least one bit line and connected at another end to receive a voltage equal to the power supply voltage level, said first MOS transistor being operative to set said at least one bit line to a first potential level substantially equal to said power supply voltage level at times when said first MOS transistor is conductive, (b) a capacitor connected at one end to receive a first signal applied after the memory data having a predetermined logic level is detected by said sense amplifying means, said first signal having a potential level substantially equal to said power supply voltage level, said capacitor connected at another end to render said first MOS transistor conductive upon application of said first signal, (c) push-up control clock generating circuit means for generating a second potential level higher than said end potential level, (d) a second MOS transistor with a current path connected at one end to said another end of said capacitor and to a gate of said first MOS transistor and at another end to said at least one bit line and with a gate connected to, and rendered conductive in response to said second potential level for setting the potential on said at least one bit line to said end potential level at times when said first MOS transistor and said second MOS transistor are both conductive at the same time, and (e) a third MOS transistor, connected at one end to the connection point between said capacitor and said second MOS transistor and connected at another end to receive a voltage equal to said reference potential level, for setting a potential on said connection point at the reference potential level while the said at least one bit line is kept at the reference potential level.

* * * * *